United States Patent
Feng et al.

(10) Patent No.: US 10,665,146 B2
(45) Date of Patent: May 26, 2020

(54) SHIFT REGISTER CIRCUIT, DRIVING METHOD, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Silin Feng, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/750,622

(22) PCT Filed: May 26, 2017

(86) PCT No.: PCT/CN2017/086047
§ 371 (c)(1),
(2) Date: Feb. 6, 2018

(87) PCT Pub. No.: WO2017/219824
PCT Pub. Date: Dec. 28, 2017

(65) Prior Publication Data
US 2020/0090570 A1    Mar. 19, 2020

(30) Foreign Application Priority Data

Jun. 24, 2016 (CN) .......................... 2016 1 0473194

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2008/0191994 A1    8/2008  Chiang et al.
2012/0293401 A1*  11/2012  Li ........................ G11C 19/184
                                                                    345/100
(Continued)

FOREIGN PATENT DOCUMENTS

CN    101241765 A    8/2008
CN    102956269 A    3/2013
(Continued)

OTHER PUBLICATIONS

First Office Action for Chinese Application No. 201610473194.6, dated Feb. 13, 2018, 7 Pages.
(Continued)

*Primary Examiner* — Matthew Yeung
(74) *Attorney, Agent, or Firm* — Brooks Kushman P.C.

(57) ABSTRACT

A shift register circuit, a driving method, a gate driving circuit and a display device are provided. The shift register circuit includes an input circuit; a reset circuit; a first pull-up node control circuit; a second pull-up node control circuit for controlling the pull-up node to couple to the second level output terminal when a potential of the pull-down node is a first level; a first pull-down node control circuit for controlling the potential of the pull-down node being the first level in the reset phase; a second pull-down node control circuit for controlling the pull-down node to couple to the second level output terminal when the potential of the pull-up node (Continued)

is the first level; a gate drive signal output circuit; and a carry signal output circuit for controlling the carry signal output terminal to output a carry signal under control of the pull-up node and the pull-down node.

20 Claims, 6 Drawing Sheets

(56) References Cited

U.S. PATENT DOCUMENTS

| | | |
|---|---|---|
| 2014/0010341 A1 | 1/2014 | Wu et al. |
| 2014/0093028 A1 | 4/2014 | Wu |
| 2015/0317936 A1* | 11/2015 | Yang .................... G09G 3/3677 345/100 |
| 2016/0064098 A1 | 3/2016 | Han et al. |

FOREIGN PATENT DOCUMENTS

| | | |
|---|---|---|
| CN | 103700357 A | 4/2014 |
| CN | 105609135 A | 5/2016 |
| CN | 106157867 A | 11/2016 |
| JP | 2015518625 A | 7/2015 |

OTHER PUBLICATIONS

International Search Report and Written Opinion for Application No. PCT/CN2017/086047, dated Aug. 30, 2017, 10 Pages.

* cited by examiner

SHIFT REGISTER CIRCUIT, DRIVING METHOD, GATE DRIVING CIRCUIT AND DISPLAY DEVICE

CROSS-REFERENCE TO RELATED APPLICATIONS

This application is the U.S. national phase of PCT Application No. PCT/CN2017/086047 filed on May 26, 2017, which claims priority to Chinese Patent Application No. 201610473194.6 filed on Jun. 24, 2016, which are incorporated herein by reference in their entireties.

TECHNICAL FIELD

The present disclosure relates to the field of display driving technology, and in particular to a shift register circuit, a driving method, a gate driving circuit and a display device.

BACKGROUND

In a shift register circuit in the related art, a gate electrode signal output terminal directly provides an input signal and a reset signal to an adjacent level shift register circuit, and thus has a poor driving capability. When a potential of a pull-down node is of a first level, the shift register circuit in the related art cannot control a potential of a pull-up node to be a second level; when the potential of the pull-up node is of the first level, the shift register circuit in the related art cannot control the potential of the pull-down node to be the second level; and thus, the shift register circuit in the related art cannot ensure that the potential of the pull-up node is maintained to be the second level in a reset phase and an output cut-off maintenance phase, and cannot ensure that the potential of the pull-down node is maintained to be the second level in an input phase and an output phase, and thus cannot ensure normally outputting of the gate drive signal. When the potentials of the pull-up node and the pull-down node are low levels, the shift register circuit in the related art controls values of the low levels to be equal to a value of a low level of the gate drive signal, which may result in that a gate drive signal output transistor cannot be turned off properly, thereby affecting normal outputting of the gate drive signal.

SUMMARY

An object of the present disclosure is to provide a shift register circuit, a driving method, a gate driving circuit and a display device, which can solve the problems that the shift register circuit in the related art has a low driving capability and cannot set low-level signals of different level values, thereby resulting in abnormal outputting of the gate drive signal and the carry signal.

In order to achieve the above object, the present disclosure provides a shift register circuit which includes:

a gate drive signal output terminal;

a carry signal output terminal;

an input circuit which is coupled to an input terminal, a first level output terminal and a pull-up node, respectively;

a reset circuit which is coupled to a reset terminal, a second level output terminal and the pull-up node, respectively, and which is configured to, in a reset phase, control the pull-up node to be coupled to the second level output terminal under control of a reset signal received by the reset terminal;

a first pull-up node control circuit coupled to the pull-up node and configured to control bootstrapped pull up of a potential of the pull-up node in an output phase;

a second pull-up node control circuit, which is coupled to the pull-up node, a pull-down node and the second level output terminal, respectively, and which is configured to, when a potential of the pull-down node is a first level, control the pull-up node to be coupled to the second level output terminal;

a first pull-down node control circuit coupled to the pull-down node and configured to control the potential of the pull-down node to be the first level in the reset phase;

a second pull-down node control circuit which is coupled to the pull-down node, the pull-up node and the second level output terminal, respectively, and which is configured to, when the potential of the pull-up node is the first level, control the pull-down node to be coupled to the second level output terminal;

a gate drive signal output circuit which is coupled to the pull-up node, the pull-down node, the gate drive signal output terminal and a third level output terminal, respectively; and a carry signal output circuit which is coupled to the pull-up node, the pull-down node, the carry signal output terminal and the third level output terminal, respectively, and which is configured to control the carry signal output terminal to output a carry signal under control of the pull-up node and the pull-down node;

wherein the input terminal is coupled to a carry signal output terminal of an adjacent previous level shift register circuit, and the reset terminal is coupled to a carry signal output terminal of an adjacent next level shift register circuit;

when transistors contained in the gate drive signal output circuit and in the carry signal output circuit are n-type transistors, a second level is smaller than a third level;

when transistors contained in the gate drive signal output circuit and in the carry signal output circuit are p-type transistors, the second level is greater than the third level.

Specifically, the carry signal and the gate drive signal output from the gate drive signal output terminal are the same.

Specifically, the second pull-up node control circuit includes a first transistor having a gate electrode being coupled to the pull-down node, a first electrode being coupled to the pull-up node, and a second electrode being coupled to the second level output terminal;

the second pull-down node control circuit includes a second transistor having a gate electrode being coupled to the pull-up node, a first electrode being coupled to the pull-down node, and a second electrode being coupled to the second level output terminal.

Specifically, the carry signal output circuit includes:

a third transistor having a gate electrode being coupled to the pull-up node, a first electrode being coupled to a first clock signal output terminal, a second electrode being coupled to the carry signal output terminal, and a fourth transistor having a gate electrode being coupled to the pull-down node, a first electrode being coupled to the carry signal output terminal, and a second electrode being coupled to the third level output terminal.

Specifically, the input terminal is configured to receive an input signal;

the input circuit is configured to, in the input phase, control the pull-up node to be coupled to the first level output terminal under control of the input signal;

the gate drive signal output circuit is further coupled to the first clock signal output terminal, and is configured to, control the gate drive signal output terminal to be coupled to the first clock signal output terminal under control of the pull-up node in the input phase and the output phase, and control the gate drive signal output terminal to be coupled to the third level output terminal under control of the pull-down node in the reset phase and the output cut-off maintenance phase.

Specifically, the first pull-up node control circuit includes a first storage capacitor;

the first storage capacitor is coupled between the pull-up node and the carry signal output terminal, or, the first storage capacitor is coupled between the pull-up node and the gate drive signal output terminal.

Specifically, the first pull-down node control circuit includes: a fifth transistor having a gate electrode being coupled to a second clock signal output terminal, a first electrode being coupled to the second clock signal output terminal, and a second electrode being coupled to the pull-down node; and a second storage capacitor having a first end being coupled to the pull-down node, and a second end being coupled to the third level output terminal;

where phases of the second clock signal and the first clock signal are reversed;

wherein the gate drive signal output circuit includes:

a sixth transistor having a gate electrode being coupled to the pull-up node, a first electrode being coupled to the first clock signal output terminal, and a second electrode being coupled to the gate drive signal output terminal, and a seventh transistor having a gate electrode being coupled to the pull-down node, a first electrode being coupled to the gate drive signal output terminal, and a second electrode being coupled to the third level output terminal.

Specifically, the gate drive signal output circuit is further coupled to the second clock signal output terminal, and is further configured to, when the second clock signal is of the first level, control the gate drive signal output terminal to be coupled to the third level output terminal.

Specifically, when the first transistor, the second transistor, the third transistor, the fourth transistor, the fifth transistor, the sixth transistor and the seventh transistor are n-type transistors, the third level is a first low level, the second level is a second low level, the second low level is less than the first low level, and the first level is a high level.

Specifically, when the first transistor, the second transistor, the third transistor, the fourth transistor, the fifth transistor, the sixth transistor and the seventh transistor are p-type transistors, the third level is a first low level, the second level is a second low level, the second low level is greater than the first low level, and the first level is a high level.

The present disclosure further provides a shift register circuit driving method, which is applied to the above shift register circuit, and the driving method includes:

in an input phase of one display cycle, controlling, by the input circuit, a potential of the pull-up node to be a first level; controlling, by the second pull-down node control circuit, the pull-down node to be coupled to the second level output terminal; controlling, by the carry signal output circuit, the carry signal output terminal to output a third level; and controlling, by the gate drive signal output circuit, the gate drive signal output terminal to output the third level;

in an output phase of one display cycle, controlling, by the first pull-up node circuit, to bootstrapped pull up the potential of the pull-up node; controlling, by the second pull-down node control circuit, the pull-down node to be coupled to the second level output terminal; controlling, by the carry signal output circuit, the carry signal output terminal to output the first level; and controlling, by the gate drive signal output circuit, the gate drive signal output terminal to output the first level;

in a reset phase of one display cycle, controlling, by the reset circuit under control of a reset signal received by the reset terminal, the pull-up node to be coupled to the second level output terminal; controlling, by the first pull-down node control circuit, the potential of the pull-down node to be the first level; controlling, by the second pull-up node control circuit, the pull-up node to be coupled to the second level output terminal; controlling, by the carry signal output circuit, the carry signal output terminal to output the third level; and controlling, by the gate drive signal output circuit, the gate drive signal output terminal to output the third level;

in an output cut-off maintenance phase of one display cycle, controlling, by the first pull-down node control circuit, the potential of the pull-down node to be maintained at the first level; controlling, by the second pull-up node control circuit, the pull-up node to be coupled to the second level output terminal; controlling, by the carry signal output circuit, the carry signal output terminal to continue outputting the third level, and controlling, by the gate drive signal output circuit, the gate drive signal output terminal to continue outputting the third level.

The present disclosure further provides a gate driving circuit which includes the above shift register circuit. An input terminal of the shift register circuit is coupled to a carry signal output terminal of an adjacent previous level shift register circuit, and a reset terminal of the shift register circuit is coupled to a carry signal output terminal of an adjacent next level shift register circuit.

The present disclosure further provides a display device which includes the above gate driving circuit.

The present disclosure further provides a shift register circuit including:

a first level output terminal configured to output a first level;

a second level output terminal configured to output a second level;

a third level output terminal configured to output a third level;

a first transistor having a gate electrode being coupled to a pull-down node, a first electrode being coupled to a pull-up node, and a second electrode being coupled to the second level output terminal and configured to receive the second level;

a second transistor having a gate electrode being coupled to the pull-up node, a first electrode being coupled to the pull-down node, and a second electrode being coupled to the second level output terminal;

a third transistor having a gate electrode being coupled to the pull-up node, a first electrode being coupled to a first clock signal output terminal, a second electrode being coupled to a carry signal output terminal;

a fourth transistor having a gate electrode being coupled to the pull-down node, a first electrode being coupled to the carry signal output terminal, and a second electrode being coupled to the third level output terminal;

a fifth transistor having a gate electrode being coupled to a second clock signal output terminal, a first electrode being coupled to the second clock signal output terminal, and a second electrode being coupled to the pull-down node;

a sixth transistor having a gate electrode being coupled to the pull-up node, a first electrode being coupled to the first clock signal output terminal, and a second electrode being coupled to the gate drive signal output terminal, and a seventh transistor having a gate electrode being coupled to the pull-down node, a first electrode being coupled to the gate drive signal output terminal, and a second electrode being coupled to the third level output terminal;

an eighth transistor having a gate electrode being coupled to the second clock signal output terminal, a first electrode being coupled to the gate drive signal output terminal, and a source electrode being coupled to the third level output terminal;

a ninth transistor having a gate electrode being coupled to a carry signal output terminal of an adjacent previous level shift register circuit and a first electrode being coupled to the first level output terminal;

a tenth transistor having a gate electrode being coupled to the carry signal output terminal of the adjacent previous level shift register circuit, a first electrode being coupled to a second electrode of the ninth transistor, and a second electrode being coupled to the pull-up node;

an eleventh transistor having a gate electrode being coupled to a carry signal output terminal of an adjacent next level shift register, and a first electrode being coupled to the pull-up node;

a twelfth transistor having a gate electrode being coupled to the carry signal output terminal of the adjacent next level shift register, a first electrode being coupled to a first electrode of the eleventh transistor, and a second electrode being coupled to the second level output terminal;

a first storage capacitor coupled between the pull-up node and one of the carry signal output terminal and the gate drive signal output terminal; and a second storage capacitor having a first end being coupled to the pull-down node, and a second end being coupled to the third level output terminal;

wherein when the first transistor, the second transistor, the third transistor, the fourth transistor, the fifth transistor, the sixth transistor, the seventh transistor and the eighth are n-type transistors, the third level is a first low level, the second level is a second low level, the second low level is less than the first low level, and the first level is a high level; and when the first transistor, the second transistor, the third transistor, the fourth transistor, the fifth transistor, the sixth transistor, the seventh transistor and the eighth are p-type transistors, the third level is a first low level, the second level is a second low level, the second low level is greater than the first low level, and the first level is a high level.

Comparing with the related art, in the shift register circuit, the driving method, a gate driving circuit and the display device of the present disclosure, the reset circuit controls the PU node to be coupled to the second level output terminal in the reset phase, the second pull-up node control circuit controls the potential of the PU node to be the second level when the potential of the PD node is the first level, the second pull-down node control circuit controls the potential of the PD node to be the second level when the potential of the PU node is the first level, thereby ensuring that the potential of the PD node is maintained to be the second level in the input phase and in the output phase, and the potential of the PU node is maintained to be the second level in the rest phase and an output cut-off maintenance phase, so as to improve the stability of the shift register circuit. In the shift register circuit according to one embodiment of the present disclosure, different level values are provided to ensure a normal output of the gate drive signal and the carry signal. Further, in the shift register circuit according to one embodiment of the present disclosure, the carry signal output terminal provides a reset signal to the previous shift register circuit, and provides an input signal to the next shift register circuit, thereby improving the driving capability of the shift register circuit.

DETAILED DESCRIPTION

The technical solutions of the present disclosure will be described hereinafter in a clear and complete manner in conjunction with the drawings of embodiments the present disclosure. Obviously, the following embodiments are merely a part of, rather than all of, the embodiments of the present disclosure, and based on these embodiments, a person skilled in the art may obtain the other embodiments, which also fall within the scope of the present disclosure.

Figure 1:
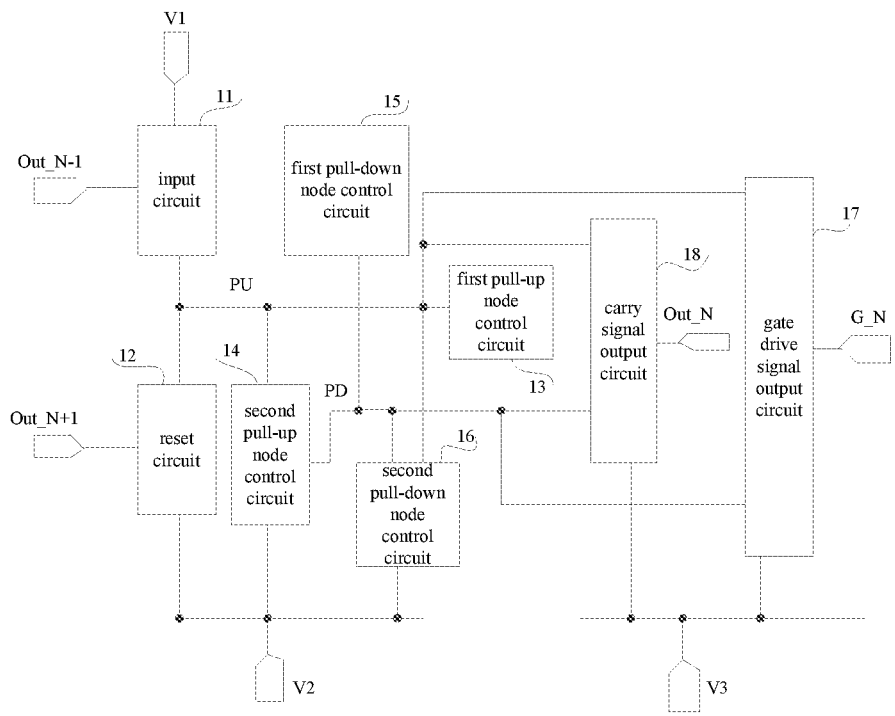
FIG. 1 is a block diagram of a shift register circuit according to an embodiment of the present disclosure.

As shown in FIG. 1, a shift register circuit according to an embodiment of the present disclosure includes a gate drive signal output terminal G_N and a carry signal output terminal Out_N. The shift register circuit further includes:

an input circuit 11, which is coupled to an input terminal, a first level output terminal V1 and a pull-up (PU) node, respectively;

a reset circuit 12, which is coupled to a reset terminal, a second level output terminal V2 and the PU node, respectively, and which is configured to, in a reset phase, control the PU node to be coupled to the second level output terminal V2 under control of a reset signal received by the reset terminal;

a first pull-up node control circuit 13 coupled to the PU node and configured to control bootstrapped pull up of a potential of the PU node in an output phase;

a second pull-up node control circuit 14, which is coupled to the PU node, a pull-down (PD) node and the second level output terminal V2, respectively, and is configured to, when a potential of the PD node is a first level, control the PU node to be coupled to the second level output terminal V2;

a first pull-down node control circuit 15 coupled to the PD node and configured to control the potential of the PD node to be the first level in the reset phase;

a second pull-down node control circuit 16 which is coupled to the PD node, the PU node and the second level output terminal V2, respectively, and is configured to, when the potential of the PU node is the first level, control the PD node to be coupled to the second level output terminal V2;

a gate drive signal output circuit 17 which is coupled to the PU node, the PD node, the gate drive signal output terminal G_N and a third level output terminal V3, respectively; and a carry signal output circuit 18 which is coupled to the PU node, the PD node, the carry signal output terminal Out_N and the third level output terminal V3, respectively, and is configured to control the carry signal output terminal to output a carry signal under control of the PU node and the PD node.

When transistors contained in the gate drive signal output circuit 17 and in the carry signal output circuit 18 are n-type transistors, a second level is smaller than a third level, thereby controlling the transistors to be turned off in corresponding phase.

When transistors contained in the gate drive signal output circuit and in the carry signal output circuit are p-type transistors, the second level is greater than the third level, thereby controlling the transistors to be turned off in corresponding phase.

The input terminal is coupled to a carry signal output terminal Out_N−1 of an adjacent previous level shift register circuit, and the reset terminal is coupled to a carry signal output terminal Out_N+1 of an adjacent next level shift register.

In the shift register circuit according to one embodiment of the present disclosure, the reset circuit controls the PU node to be coupled to the second level output terminal in the reset phase, the second pull-up node control circuit controls the potential of the PU node to be the second level when the potential of the PD node is the first level, the second pull-down node control circuit controls the potential of the PD node to be the second level when the potential of the PU node is the first level, thereby ensuring that the potential of the PD node is maintained to be the second level in the input phase and in the output phase, and the potential of the PU node is maintained to be the second level in the rest phase and an output cut-off maintenance phase, so as to improve the stability of the shift register circuit. In the shift register circuit according to one embodiment of the present disclosure, different level values are provided to ensure a normal output of the gate drive signal and the carry signal. Further, in the shift register circuit according to one embodiment of the present disclosure, the carry signal output terminal provides a reset signal to the previous shift register circuit, and provides an input signal to the next shift register circuit, thereby improving the driving capability of the shift register circuit.

Optionally, the carry signal and the gate drive signal output from the gate drive signal output terminal are identical, so that the carry signal can be used instead of the gate drive signal, to provide a reset signal to the previous shift register circuit, and provide an input signal to the next shift register circuit.

Figure 2:
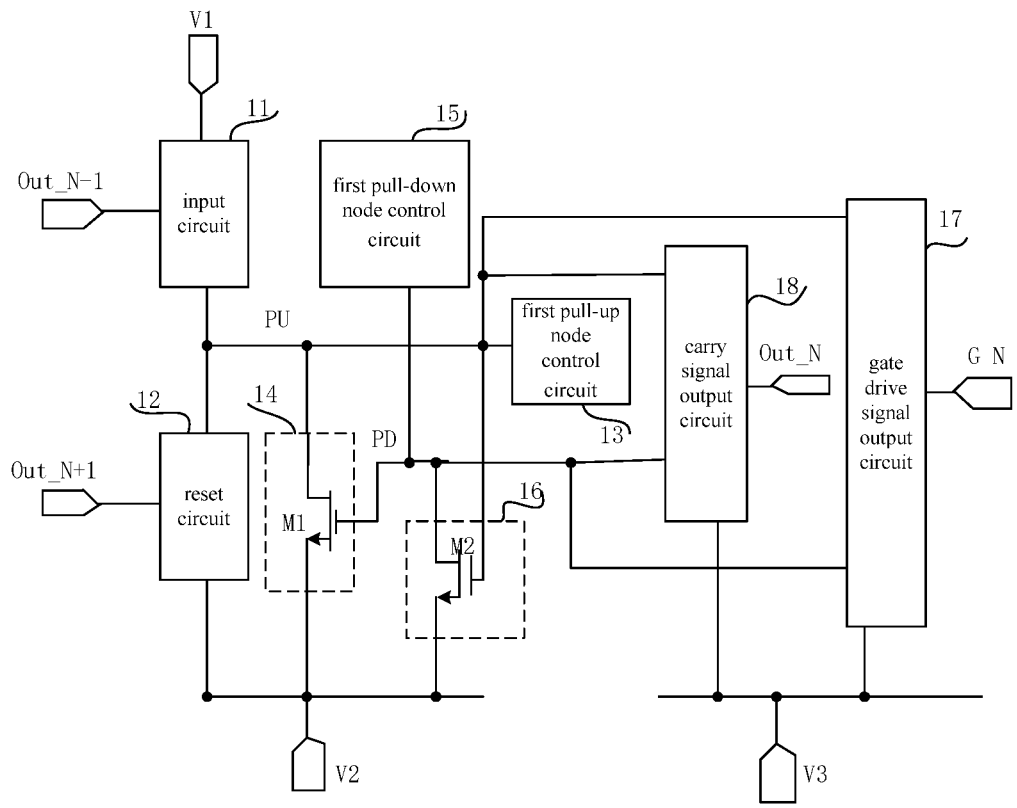
FIG. 2 is a block diagram of a shift register circuit according to another embodiment of the present disclosure.

Specifically, as shown in FIG. 2, the second pull-up node control circuit 14 may include a first transistor M1 having a gate electrode being coupled to the PD node, a first electrode being coupled to the PU node, and a second electrode being coupled to the second level output terminal V2.

The second pull-down node control circuit 16 may include a second transistor M2 having a gate electrode being coupled to the PU node, a first electrode being coupled to the PD node, and a second electrode being coupled to the second level output terminal V2.

In FIGS. 2, M1 and M2 are n-type transistors. However, in actual applications, M1 and M2 may also be p-type transistors, and types of the transistors are not limited.

Figure 3:
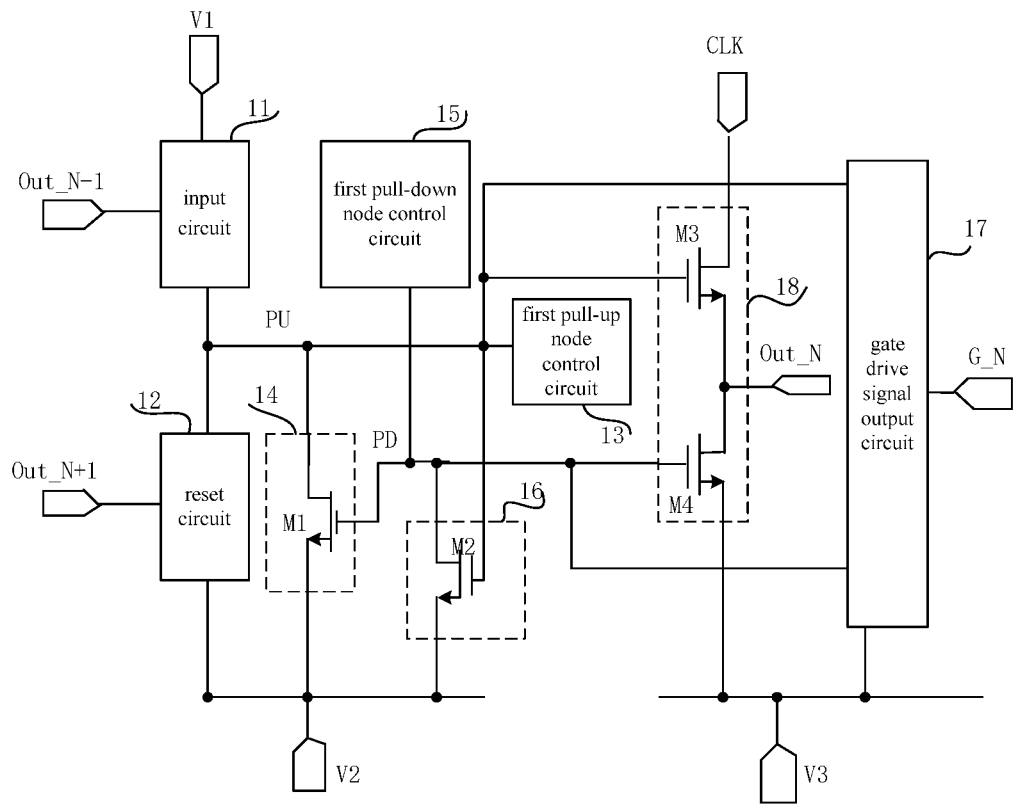
FIG. 3 is a block diagram of a shift register circuit according to still another embodiment of the present disclosure.

Specifically, as shown in FIG. 3, the carry signal output circuit 18 may include:

a third transistor M3 having a gate electrode being coupled to the PU node, a first electrode being coupled to a first clock signal output terminal, a second electrode being coupled to the carry signal output terminal Out_N, and a fourth transistor M4 having a gate electrode being coupled to the PD node, a first electrode being coupled to the carry signal output terminal Out_N, and a second electrode being coupled to the third level output terminal V3.

The first clock signal output terminal outputs a first clock signal CLK.

In FIGS. 3, M3 and M4 are n-type transistors. However, in actual applications, M3 and M4 may also be p-type transistors, and types of the transistors are not limited.

According to one embodiment, the input signal is received by the input terminal.

The input circuit is configured to, in the input phase, control the PU node to be coupled to the first level output terminal under control of the input signal.

Figure 4:
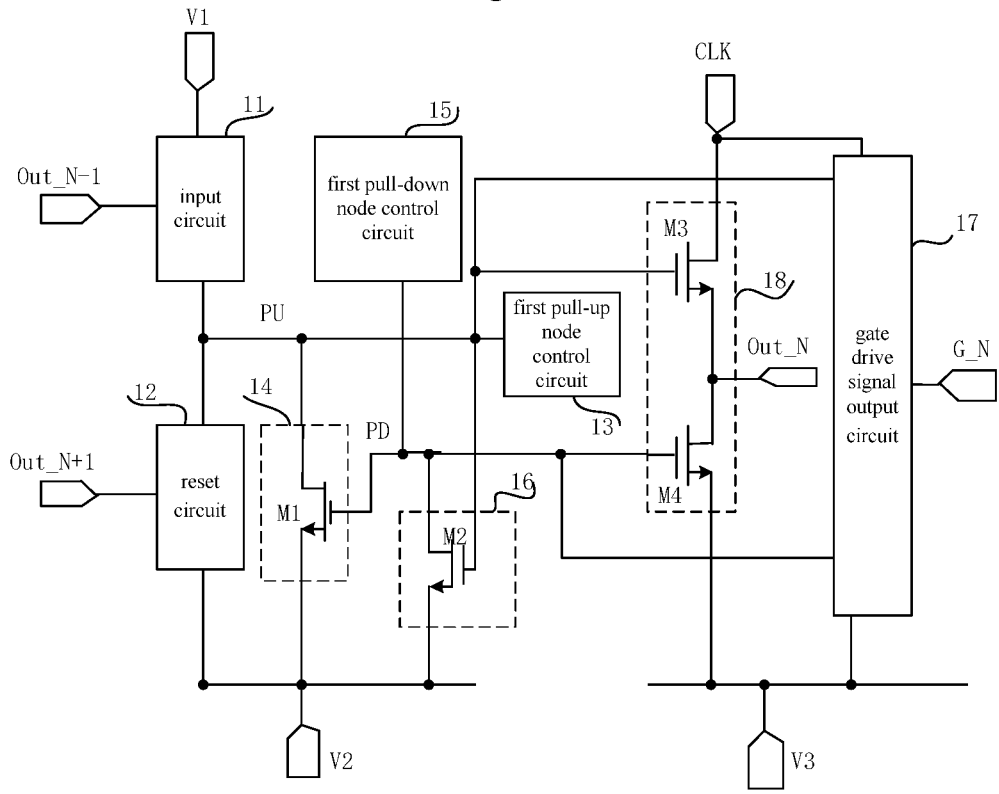
FIG. 4 is a block diagram of a shift register circuit according to yet another embodiment of the present disclosure.

As shown in FIG. 4, the gate drive signal output circuit 17 is further coupled to the first clock signal output terminal (which outputs a first clock signal CLK), and is configured to, control the gate drive signal output terminal G_N to be coupled to the first clock signal output terminal under control of the PU node in the input phase and the output phase, and control the gate drive signal output terminal G_N to be coupled to the third level output terminal V3 under control of the PD node in the reset phase and the output cut-off maintenance phase.

Specifically, the first pull-up node control circuit may include a first storage capacitor.

The first storage capacitor is coupled between the PU node and the carry signal output terminal. Or, the first storage capacitor is coupled between the PU node and the gate drive signal output terminal.

Figure 5:
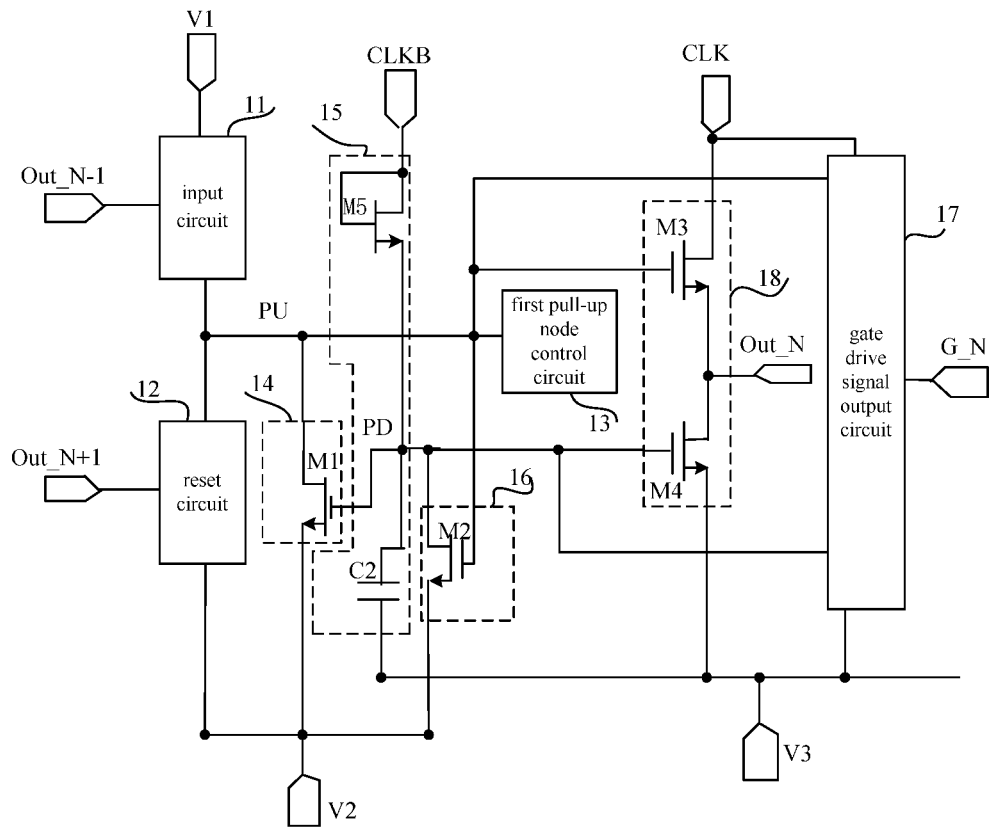
FIG. 5 is a block diagram of a shift register circuit according to still yet another embodiment of the present disclosure.

Specifically, as shown in FIG. 5, the first pull-down node control circuit 15 may include: a fifth transistor M5 having a gate electrode being coupled to a second clock signal output terminal, a first electrode being coupled to the second clock signal output terminal, and a second electrode being coupled to the PD node; and a storage capacitor having a first end being coupled to the PD node, and a second end being coupled to the third level output terminal V3, where the second clock signal output terminal outputs a second clock signal CLKB, and phases of the second clock signal CLKB and the first clock signal CLK are reversed.

In FIG. 5, M5 is an n-type transistor. However, in actual applications, M5 may also be a p-type transistor, and the type of the transistor is not limited.

Specifically, the gate drive signal output circuit includes:

a sixth transistor having a gate electrode being coupled to the PU node, a first electrode being coupled to the first clock signal output terminal, and a second electrode being coupled to the gate drive signal output terminal, and a seventh transistor having a gate electrode being coupled to the PD node, a first electrode being coupled to the gate drive signal output terminal, and a second electrode being coupled to the third level output terminal.

Figure 6:
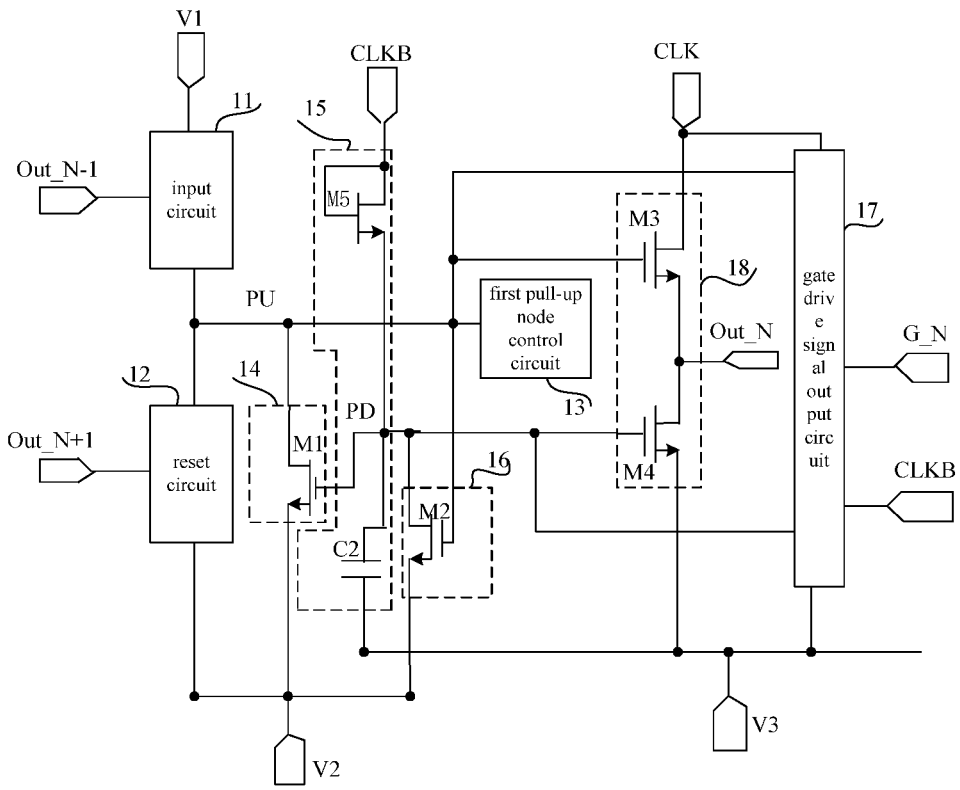
FIG. 6 is a block diagram of a shift register circuit according to still yet another embodiment of the present disclosure.

Specifically, as shown in FIG. 6, the gate drive signal output circuit 17 is further coupled to the second clock signal output terminal (which outputs the second clock signal CLKB), and is further configured to, when the second clock signal CLKB is of the first level, control the gate drive signal output terminal G_N to be coupled to the third level output terminal V3.

Specifically, when the first transistor, the second transistor, the third transistor, the fourth transistor, the fifth transistor, the sixth transistor and the seventh transistor are n-type transistors, the third level is a first low level, the second level is a second low level, the second low level is less than the first low level, and the first level is a high level.

Specifically, when the first transistor, the second transistor, the third transistor, the fourth transistor, the fifth transistor, the sixth transistor and the seventh transistor are p-type transistors, the third level is a first low level, the second level is a second low level, the second low level is greater than the first low level, and the first level is a high level.

Further, when the shift register circuit of one embodiment of the present disclosure is applied to a gate driving circuit, bidirectional scanning can be realized, i.e., scanning forwardly or scanning reversely. The following example illustrates a shift register circuit capable of scanning forwardly. In actual applications, if scanning reversely is desired, it is only needed to exchange the input terminal and the reset terminal, change VDD in the following FIG. 7 to be VSS2, and enable the source electrode of M12 shown in FIG. 7 to receive VDD.

The shift register circuit of the present disclosure will be illustrated hereinafter with an example.

Figure 7:
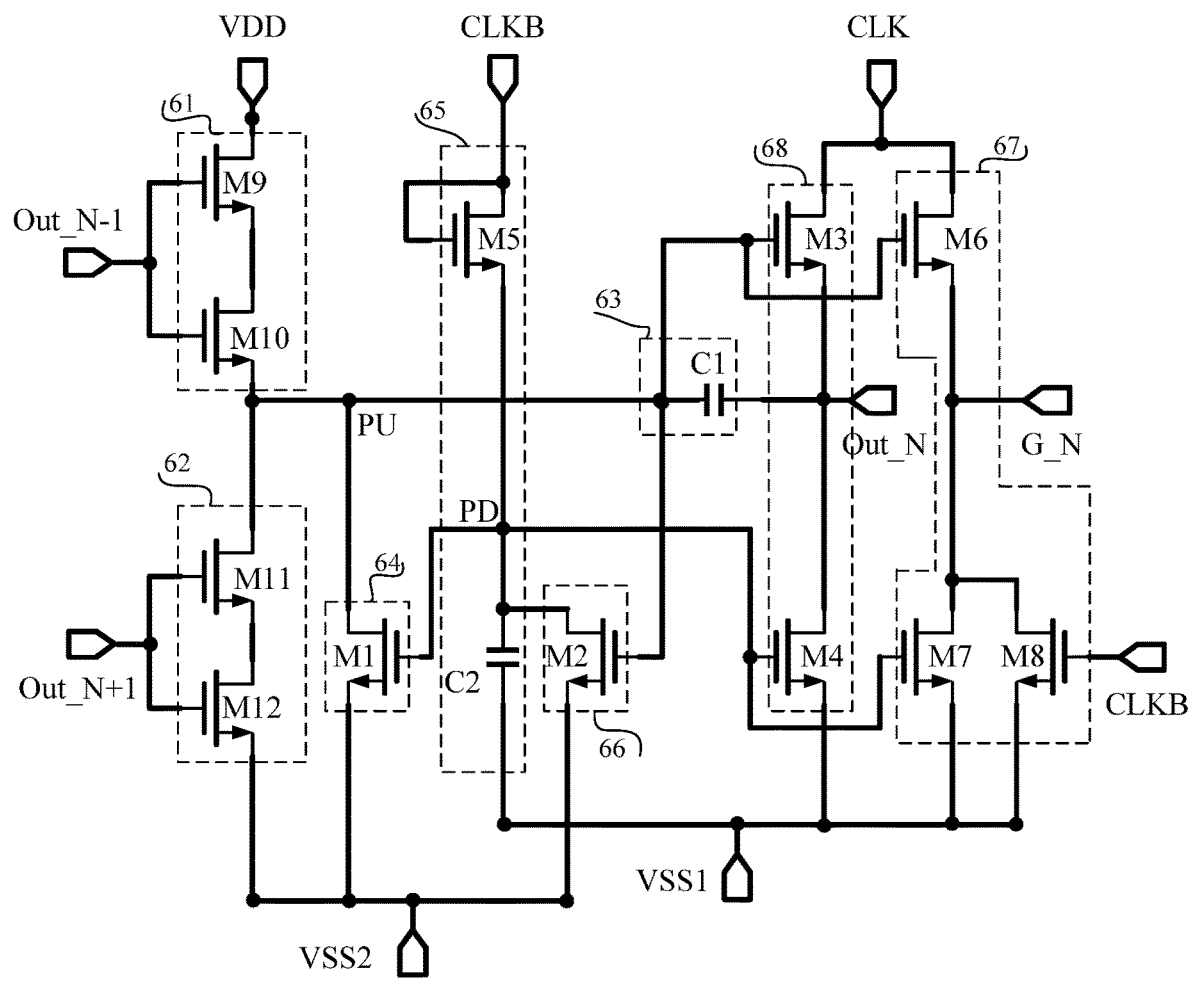
FIG. 7 is a circuit diagram of a shift register circuit according to an exemplary embodiment of the present disclosure.

As shown in FIG. 7, an example of the shift register circuit of the present disclosure includes a gate drive signal output terminal G_N, a carry signal output terminal Out_N, an input circuit 61, a reset circuit 62, a first pull-up node control circuit 63, a second pull-up node control circuit 64, a first pull-down node control circuit 65, a second pull-down node control circuit 66, a gate drive signal output circuit 67 and a carry signal output circuit 68.

The second pull-up node control circuit 64 includes a first transistor M1 having a gate electrode being coupled to the PD node, a drain electrode being coupled to the PU node, and a source electrode receiving a second low level VSS2.

The second pull-down node control circuit 66 includes a second transistor M2 having a gate electrode being coupled to the PU node, a drain electrode being coupled to the PD node, and a second electrode receiving the second low level VSS2.

The carry signal output circuit 68 includes:

a third transistor M3 having a gate electrode being coupled to the PU node, a drain electrode being coupled to a first clock signal output terminal for outputting a first clock signal CLK, and a source electrode being coupled to the carry signal output terminal Out_N, and a fourth transistor M4 having a gate electrode being coupled to the PD node, a drain electrode being coupled to the carry signal output terminal Out_N, and a source electrode receiving a first low level VSS1.

The first pull-up node control circuit 63 includes a first storage capacitor C1.

The first storage capacitor C1 is coupled between the PU node and the carry signal output terminal Out_N.

The first pull-down node control circuit 65 includes: a fifth transistor M5 having a gate electrode being coupled to a second clock signal output terminal for outputting a second clock signal, a drain electrode being coupled to the second clock signal output terminal, and a source electrode being coupled to the PD node; and a second storage capacitor C2 having a first end being coupled to the PD node and a second end for receiving the first low level VSS1, where phases of the second clock signal CLKB and the first clock signal CLK are reversed.

The gate drive signal output circuit 67 includes:

a sixth transistor M6 having a gate electrode being coupled to the PU node, a drain electrode being coupled to the first clock signal output terminal for outputting the first clock signal CLK, and a source electrode being coupled to the gate drive signal output terminal G_N, and a seventh transistor M7 having a gate electrode being coupled to the PD node, a drain electrode being coupled to the gate drive signal output terminal G_N, and a source electrode for receiving the first low level VSS1; and an eighth transistor M8 having a gate electrode being coupled to the second clock signal output terminal for outputting the second clock signal CLKB, a drain electrode being coupled to the gate drive signal output terminal G_N, and a source electrode for receiving the first low level VSS1.

The input circuit 61 includes:

a ninth transistor M9 having a gate electrode being coupled to a carry signal output terminal Out_N−1 of an adjacent previous level shift register circuit and a drain electrode for receiving a high level VDD; and a tenth transistor M10 having a gate electrode being coupled to the carry signal output terminal Out_N−1 of the adjacent previous level shift register circuit, a drain electrode being coupled to a source electrode of the ninth transistor M9, and a source electrode being coupled to the PU node.

The reset circuit 62 includes:

an eleventh transistor M11 having a gate electrode being coupled to a carry signal output terminal Out_N+1 of an adjacent next level shift register, and a drain electrode being coupled to the PU node, and a twelfth transistor M12 having a gate electrode being coupled to the carry signal output terminal Out_N+1 of the adjacent next level shift register, a drain electrode being coupled to a source electrode of the eleventh transistor M11, and a source electrode for receiving the second low level VSS2, where VSS2<VSS1<0.

In FIG. 7, all transistors are n-type transistors. However, in actual applications, the various transistors may also be replaced with p-type transistors, and types of the transistors are not limited.

Figure 8:
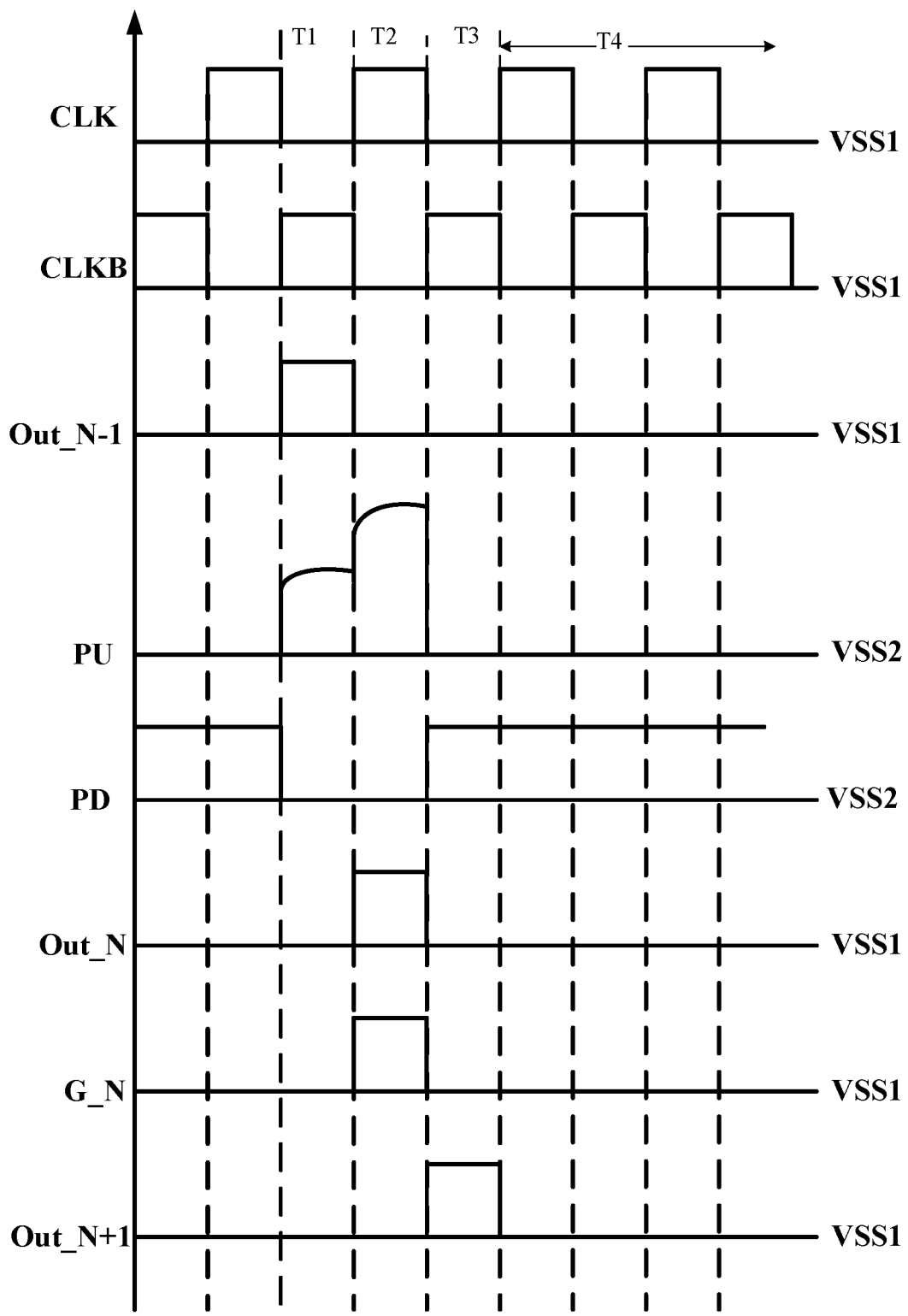
FIG. 8 is a diagram showing a timing sequence of the shift register circuit shown in FIG. 7.

As shown in FIG. 8, when the shift register circuit according to the example shown in FIG. 7 of the present disclosure works, several phases are described below.

In an input phase T1 of one display cycle, Out_N−1 outputs a high level, Out_N+1 outputs a low level, CLK is of a low level, CLKB is of high level, M9 and M10 are turned on; PU receives VDD for pre-charging C1 to enable M3 and M6 to be turned on. However, since CLK is of low level at this time, each of Out_N and G_N outputs a low level. Further, at this time, M2 is turned on to discharge C2, thereby a potential of PD being pulled down to VSS2. M1 is turned off, VSS2 is less than VSS1, thereby ensuring M4 and M7 to be turned off. Since the potential at the gate electrode of M4 is less than the potential at the source electrode of M4 and the potential at the gate electrode of M7 is less than the potential at the source electrode of M7, it is ensured that M4 and M7 are turned off, thereby ensuring normally outputting of the gate drive signal and the carry signal. Further, since CLKB is of high level at this time, M8 is turned on, and the potential of the gate drive signal output from G_N is further pulled down to VSS1.

In an output phase T2 of one display cycle, each of Out_N−1 and Out_N+1 outputs a low level, CLK is of high level, CLKB is of low level, the potential of PU is bootstrapped pulled up by C1, each of Out_N and G_N outputs high level. At this time, the potential of PD is pulled down to VSS2 and maintained by the turned-on M2, and thus M1 is turned off. Since each of source electrodes of M4 and M7 receives VSS1, the potential at the gate electrode of M4 is less than the potential at the source electrode of M4, and the potential at the gate electrode of M7 is less than the potential at the source electrode of M7, thereby ensuring that M4 and M7 are turned off, and then ensuring normally outputting of the gate drive signal and the carry signal.

In a reset phase T3 of one display cycle, Out_N−1 outputs a low level, Out_N+1 outputs a high level, CLK is of low level, CLKB is of high level, M11 and M12 are turned on to control PU to receive VSS2, and M8 is also turned on to control G_N to receive VSS1. M5 is also turned on and then the potential of PD is pulled up to a high level so as to charge C2, thereby enabling M1 to be turned on and then controlling the potential of PU to be pulled to VSS2. Further, at this time, M4 and M7 are turned on to enable each of Out_N and G_N to output VSS1, then the potential VSS2 at the gate electrode of M3 is less than the potential VSS1 at the source electrode of M3, thereby ensuring that M3 is turned off at this time. Meanwhile, the potential VSS2 at the gate electrode of M6 is less than the potential VSS1 at the source electrode of M6, thereby ensuring that M6 is turned off at this time and then ensuring normally outputting of the gate drive signal and the carry signal.

In an output cut-off maintenance phase T4 of one display cycle, each of Out_N−1 and Out_N+1 outputs a low level, CLKB alternately outputs high levels and low levels. When CLKB is of high level, the potential of PD is continued to be pulled up to the high level. When CLKB is of low level, the potential of PD is maintained by C2 to the high level, M1 is turned on, thereby controlling the potential of PU to be pulled down to VSS2. Further, at this time, M4 and M7 are turned on so that each of Out_N and G_N outputs VSS1, then the potential VSS2 at the gate electrode of M3 is less than the potential VSS1 at the source electrode of M3, thereby ensuring that M3 is turned off at this time; further, the potential VSS2 at the gate electrode of M6 is less than the potential VSS1 at the source electrode of M6, thereby ensuring that M6 is turned off at this time and then ensuring normally outputting of the gate drive signal and the carry signal until beginning of the input phase of the next display cycle.

Comparing with the related art, in the shift register circuit according to the example of the present disclosure, M3 and M4 are additionally added to control outputting of the carry signal, and the carry signal is used to provide the input signal and the reset signal for the previous level shift register and the next level shift register, thereby enhancing driving ability.

In the shift register circuit according to the example of the present disclosure, two low-level signals of different level values are used to pull down the potential of PU to VSS2 in the reset phase T3 and in the output cut-off maintenance phase T4, and to pull down the potential of PU to VSS2 in the input phase T1 and in the output phase T2, while the source electrodes of M4 and M7 receive VSS1, so that the potential of the carry signal and the potential of the gate drive signal are VSS1 in the reset phase T3 and the output cut-off maintenance phase T4 and then it is ensured that M3 and M6 are turned off in the reset phase T3 and in the output cut-off maintenance phase T4, and that M4 and M7 are turned off in the input phase T1 and in the output phase T2, thereby ensuring normally outputting of the gate drive signal and the carry signal.

One embodiment of the present disclosure provides a shift register circuit driving method, which can be applied to the above shift register circuit. The driving method includes following steps:

in an input phase of one display cycle, the input circuit controls a potential of the PU node to be a first level, the second pull-down node control circuit controls the PD node to be coupled to the second level output terminal, the carry signal output circuit controls the carry signal output terminal to output a third level, and the gate drive signal output circuit controls the gate drive signal output terminal to output the third level;

in an output phase of one display cycle, the first pull-up node control circuit controls to bootstrapped pull up the potential of the PU node, the second pull-down node control circuit continues to controlling the PD node to be coupled to the second level output terminal, the carry signal output circuit controls the carry signal output terminal to output the first level, and the gate drive signal output circuit controls the gate drive signal output terminal to output the first level;

in a reset phase of one display cycle, under control of a reset signal received by the reset terminal, the reset circuit controls the PU node to be coupled to the second level output terminal, the first pull-down node control circuit controls the potential of the PD node to be the first level, the second pull-up node control circuit controls the PU node to be coupled to the second level output terminal, the carry signal output circuit controls the carry signal output terminal to output the third level, and the gate drive signal output circuit controls the gate drive signal output terminal to output the third level;

in an output cut-off maintenance phase of one display cycle, the first pull-down node control circuit controls the potential of the PD node to be maintained at the first level, the second pull-up node control circuit controls the PU node to be coupled to the second level output terminal, the carry signal output circuit controls the carry signal output terminal to continue outputting the third level, and the gate drive signal output circuit controls the gate drive signal output terminal to continue outputting the third level.

One embodiment of the present disclosure provides a gate driving circuit which includes the above shift register circuit. An input terminal of the shift register circuit is coupled to a carry signal output terminal of an adjacent previous level shift register circuit, and a reset terminal of the shift register circuit is coupled to a carry signal output terminal of an adjacent next level shift register circuit.

Figure 9:
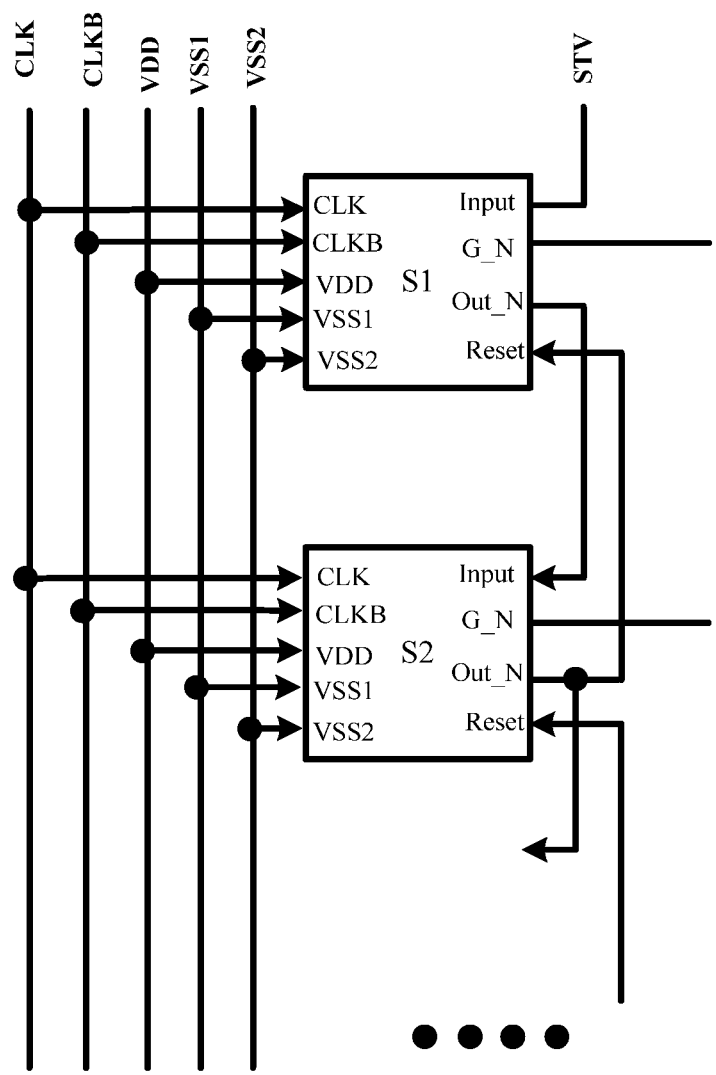
FIG. 9 is a block diagram of a gate driving circuit according to an embodiment of the present disclosure.

As shown in FIG. 9, a gate driving circuit according to an embodiment of the present disclosure includes multi-level shift register circuits.

FIG. 9 shows a first level shift register circuit S1 and a second level shift register circuit S2.

An input terminal of the first level shift register circuit S1 receives a start signal STY.

A rest terminal Reset of the first level shift register circuit S1 is coupled to a carry signal output terminal of the second level shift register circuit S2.

An input terminal of the second level shift register circuit S2 is coupled to a carry signal output terminal of the first level shift register circuit S1.

A rest terminal Reset of the second level shift register circuit S2 is coupled to a carry signal output terminal of a third level shift register circuit (which is not shown in FIG. 9).

One embodiment of the present disclosure provides a display device including the above gate driving circuit.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A shift register circuit comprising:
a gate drive signal output terminal;
a carry signal output terminal;
an input circuit which is coupled to an input terminal, a first level output terminal and a pull-up node, respectively;
a reset circuit which is coupled to a reset terminal, a second level output terminal and the pull-up node, respectively, and which is configured to, in a reset phase, control the pull-up node to be coupled to the second level output terminal under control of a reset signal received by the reset terminal;
a first pull-up node control circuit coupled to the pull-up node and configured to control bootstrapped pull up of a potential of the pull-up node in an output phase;
a second pull-up node control circuit, which is coupled to the pull-up node, a pull-down node and the second level output terminal, respectively, and which is configured to, when a potential of the pull-down node is a first level, control the pull-up node to be coupled to the second level output terminal;
a first pull-down node control circuit coupled to the pull-down node and configured to control the potential of the pull-down node to be the first level in the reset phase;
a second pull-down node control circuit which is coupled to the pull-down node, the pull-up node and the second level output terminal, respectively, and which is configured to, when the potential of the pull-up node is the first level, control the pull-down node to be coupled to the second level output terminal;
a gate drive signal output circuit which is coupled to the pull-up node, the pull-down node, the gate drive signal output terminal and a third level output terminal, respectively; and
a carry signal output circuit which is coupled to the pull-up node, the pull-down node, the carry signal output terminal and the third level output terminal, respectively, and which is configured to control the carry signal output terminal to output a carry signal under control of the pull-up node and the pull-down node;
wherein the input terminal is coupled to a carry signal output terminal of an adjacent previous level shift register circuit, and the reset terminal is coupled to a carry signal output terminal of an adjacent next level shift register circuit;
when transistors contained in the gate drive signal output circuit and in the carry signal output circuit are n-type transistors, a second level is smaller than a third level;
when transistors contained in the gate drive signal output circuit and in the carry signal output circuit are p-type transistors, the second level is greater than the third level.

2. The shift register circuit of claim 1, wherein the carry signal and the gate drive signal output from the gate drive signal output terminal are identical.

3. The shift register circuit of claim 2, wherein the second pull-up node control circuit includes a first transistor having a gate electrode being coupled to the pull-down node, a first electrode being coupled to the pull-up node, and a second electrode being coupled to the second level output terminal;
the second pull-down node control circuit includes a second transistor having a gate electrode being coupled to the pull-up node, a first electrode being coupled to the pull-down node, and a second electrode being coupled to the second level output terminal.

4. The shift register circuit of claim 3, wherein the carry signal output circuit includes:
a third transistor having a gate electrode being coupled to the pull-up node, a first electrode being coupled to a first clock signal output terminal, a second electrode being coupled to the carry signal output terminal, and
a fourth transistor having a gate electrode being coupled to the pull-down node, a first electrode being coupled to the carry signal output terminal, and a second electrode being coupled to the third level output terminal.

5. The shift register circuit of claim 4, wherein the input terminal is configured to receive an input signal;
the input circuit is configured to, in the input phase, control the pull-up node to be coupled to the first level output terminal under control of the input signal;
the gate drive signal output circuit is further coupled to the first clock signal output terminal, and is configured to, control the gate drive signal output terminal to be coupled to the first clock signal output terminal under control of the pull-up node in the input phase and the output phase, and control the gate drive signal output terminal to be coupled to the third level output terminal under control of the pull-down node in the reset phase and the output cut-off maintenance phase.

6. The shift register circuit of claim 1, wherein the first pull-up node control circuit includes a first storage capacitor;
the first storage capacitor is coupled between the pull-up node and the carry signal output terminal, or, the first storage capacitor is coupled between the pull-up node and the gate drive signal output terminal.

7. The shift register circuit of claim 5, wherein the first pull-down node control circuit includes: a fifth transistor having a gate electrode being coupled to a second clock signal output terminal, a first electrode being coupled to the second clock signal output terminal, and a second electrode being coupled to the pull-down node; and
a second storage capacitor having a first end being coupled to the pull-down node, and a second end being coupled to the third level output terminal;
where phases of the second clock signal and the first clock signal are reversed;
wherein the gate drive signal output circuit includes:
a sixth transistor having a gate electrode being coupled to the pull-up node, a first electrode being coupled to the first clock signal output terminal, and a second electrode being coupled to the gate drive signal output terminal, and
a seventh transistor having a gate electrode being coupled to the pull-down node, a first electrode being coupled to the gate drive signal output terminal, and a second electrode being coupled to the third level output terminal.

8. The shift register circuit of claim 7, wherein the gate drive signal output circuit is further coupled to the second clock signal output terminal, and is further configured to, when the second clock signal is of the first level, control the gate drive signal output terminal to be coupled to the third level output terminal.

9. The shift register circuit of claim 7, wherein when the first transistor, the second transistor, the third transistor, the fourth transistor, the fifth transistor, the sixth transistor and the seventh transistor are n-type transistors, the third level is a first low level, the second level is a second low level, the second low level is less than the first low level, and the first level is a high level.

10. The shift register circuit of claim 7, wherein when the first transistor, the second transistor, the third transistor, the fourth transistor, the fifth transistor, the sixth transistor and the seventh transistor are p-type transistors, the third level is a first low level, the second level is a second low level, the second low level is greater than the first low level, and the first level is a high level.

11. A shift register circuit driving method, which is applied to the shift register circuit of claim 1, the driving method comprising:
in an input phase of one display cycle, controlling, by the input circuit, a potential of the pull-up node to be a first level; controlling, by the second pull-down node control circuit, the pull-down node to be coupled to the second level output terminal; controlling, by the carry signal output circuit, the carry signal output terminal to output a third level; and controlling, by the gate drive signal output circuit, the gate drive signal output terminal to output the third level;
in an output phase of one display cycle, controlling, by the first pull-up node circuit, to bootstrapped pull up the potential of the pull-up node; controlling, by the second pull-down node control circuit, the pull-down node to be coupled to the second level output terminal; controlling, by the carry signal output circuit, the carry signal output terminal to output the first level; and controlling, by the gate drive signal output circuit, the gate drive signal output terminal to output the first level;
in a reset phase of one display cycle, controlling, by the reset circuit under control of a reset signal received by the reset terminal, the pull-up node to be coupled to the second level output terminal; controlling, by the first pull-down node control circuit, the potential of the pull-down node to be the first level; controlling, by the second pull-up node control circuit, the pull-up node to be coupled to the second level output terminal; controlling, by the carry signal output circuit, the carry signal output terminal to output the third level; and controlling, by the gate drive signal output circuit, the gate drive signal output terminal to output the third level;
in an output cut-off maintenance phase of one display cycle, controlling, by the first pull-down node control circuit, the potential of the pull-down node to be maintained at the first level; controlling, by the second pull-up node control circuit, the pull-up node to be coupled to the second level output terminal; controlling, by the carry signal output circuit, the carry signal output terminal to continue outputting the third level, and controlling, by the gate drive signal output circuit, the gate drive signal output terminal to continue outputting the third level.

12. A gate driving circuit comprising the shift register circuit of claim 1,
wherein an input terminal of the shift register circuit is coupled to a carry signal output terminal of an adjacent previous level shift register circuit, and a reset terminal of the shift register circuit is coupled to a carry signal output terminal of an adjacent next level shift register circuit.

13. A display device comprising the gate driving circuit of claim 12.

14. The gate driving circuit of claim 12, wherein the second pull-up node control circuit includes a first transistor having a gate electrode being coupled to the pull-down node, a first electrode being coupled to the pull-up node, and a second electrode being coupled to the second level output terminal;
the second pull-down node control circuit includes a second transistor having a gate electrode being coupled to the pull-up node, a first electrode being coupled to the pull-down node, and a second electrode being coupled to the second level output terminal.

15. The gate driving circuit of claim 14, wherein the carry signal output circuit includes:
a third transistor having a gate electrode being coupled to the pull-up node, a first electrode being coupled to a first clock signal output terminal, a second electrode being coupled to the carry signal output terminal, and
a fourth transistor having a gate electrode being coupled to the pull-down node, a first electrode being coupled to the carry signal output terminal, and a second electrode being coupled to the third level output terminal.

16. The gate driving circuit of claim 15, wherein the input terminal is configured to receive an input signal;
the input circuit is configured to, in the input phase, control the pull-up node to be coupled to the first level output terminal under control of the input signal;
the gate drive signal output circuit is further coupled to the first clock signal output terminal, and is configured to, control the gate drive signal output terminal to be coupled to the first clock signal output terminal under control of the pull-up node in the input phase and the output phase, and control the gate drive signal output terminal to be coupled to the third level output terminal under control of the pull-down node in the reset phase and the output cut-off maintenance phase.

17. The gate driving circuit of claim 16, wherein the first pull-up node control circuit includes a first storage capacitor;
the first storage capacitor is coupled between the pull-up node and the carry signal output terminal, or, the first storage capacitor is coupled between the pull-up node and the gate drive signal output terminal.

18. The gate driving circuit of claim 16, wherein the first pull-down node control circuit includes: a fifth transistor having a gate electrode being coupled to a second clock signal output terminal, a first electrode being coupled to the second clock signal output terminal, and a second electrode being coupled to the pull-down node; and
a second storage capacitor having a first end being coupled to the pull-down node, and a second end being coupled to the third level output terminal;
where phases of the second clock signal and the first clock signal are reversed;
wherein the gate drive signal output circuit includes:
a sixth transistor having a gate electrode being coupled to the pull-up node, a first electrode being coupled to the first clock signal output terminal, and a second electrode being coupled to the gate drive signal output terminal, and a seventh transistor having a gate electrode being coupled to the pull-down node, a first electrode being coupled to the gate drive signal output terminal, and a second electrode being coupled to the third level output terminal.

19. The gate driving circuit of claim 18, wherein the gate drive signal output circuit is further coupled to the second clock signal output terminal, and is further configured to, when the second clock signal is of the first level, control the gate drive signal output terminal to be coupled to the third level output terminal.

20. A shift register circuit comprising:

a first level output terminal configured to output a first level;

a second level output terminal configured to output a second level;

a third level output terminal configured to output a third level;

a first transistor having a gate electrode being coupled to a pull-down node, a first electrode being coupled to a pull-up node, and a second electrode being coupled to the second level output terminal and configured to receive the second level;

a second transistor having a gate electrode being coupled to the pull-up node, a first electrode being coupled to the pull-down node, and a second electrode being coupled to the second level output terminal;

a third transistor having a gate electrode being coupled to the pull-up node, a first electrode being coupled to a first clock signal output terminal, a second electrode being coupled to a carry signal output terminal;

a fourth transistor having a gate electrode being coupled to the pull-down node, a first electrode being coupled to the carry signal output terminal, and a second electrode being coupled to the third level output terminal;

a fifth transistor having a gate electrode being coupled to a second clock signal output terminal, a first electrode being coupled to the second clock signal output terminal, and a second electrode being coupled to the pull-down node;

a sixth transistor having a gate electrode being coupled to the pull-up node, a first electrode being coupled to the first clock signal output terminal, and a second electrode being coupled to the gate drive signal output terminal, and a seventh transistor having a gate electrode being coupled to the pull-down node, a first electrode being coupled to the gate drive signal output terminal, and a second electrode being coupled to the third level output terminal;

an eighth transistor having a gate electrode being coupled to the second clock signal output terminal, a first electrode being coupled to the gate drive signal output terminal, and a source electrode being coupled to the third level output terminal;

a ninth transistor having a gate electrode being coupled to a carry signal output terminal of an adjacent previous level shift register circuit and a first electrode being coupled to the first level output terminal;

a tenth transistor having a gate electrode being coupled to the carry signal output terminal of the adjacent previous level shift register circuit, a first electrode being coupled to a second electrode of the ninth transistor, and a second electrode being coupled to the pull-up node;

an eleventh transistor having a gate electrode being coupled to a carry signal output terminal of an adjacent next level shift register, and a first electrode being coupled to the pull-up node;

a twelfth transistor having a gate electrode being coupled to the carry signal output terminal of the adjacent next level shift register, a first electrode being coupled to a first electrode of the eleventh transistor, and a second electrode being coupled to the second level output terminal;

a first storage capacitor coupled between the pull-up node and one of the carry signal output terminal and the gate drive signal output terminal; and a second storage capacitor having a first end being coupled to the pull-down node, and a second end being coupled to the third level output terminal;

wherein when the first transistor, the second transistor, the third transistor, the fourth transistor, the fifth transistor, the sixth transistor, the seventh transistor and the eighth are n-type transistors, the third level is a first low level, the second level is a second low level, the second low level is less than the first low level, and the first level is a high level; and when the first transistor, the second transistor, the third transistor, the fourth transistor, the fifth transistor, the sixth transistor, the seventh transistor and the eighth are p-type transistors, the third level is a first low level, the second level is a second low level, the second low level is greater than the first low level, and the first level is a high level.

* * * * *